United States Patent
Ryu

(10) Patent No.: US 7,514,862 B2
(45) Date of Patent: Apr. 7, 2009

(54) ORGANIC LIGHT EMITTING DISPLAY HAVING AN NAF LAYER AND METHOD OF FABRICATING THE ORGANIC LIGHT EMITTING DISPLAY

(75) Inventor: Seoung-Yoon Ryu, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 54 days.

(21) Appl. No.: 11/265,398

(22) Filed: Nov. 1, 2005

(65) Prior Publication Data

US 2006/0097632 A1    May 11, 2006

(30) Foreign Application Priority Data

Nov. 5, 2004    (KR)    ............. 10-2004-0090054

(51) Int. Cl.
*H01J 1/62* (2006.01)
*H05B 33/00* (2006.01)

(52) U.S. Cl. .................. 313/504; 428/690; 445/23

(58) Field of Classification Search ......... 313/501–512; 428/690; 445/23–25
See application file for complete search history.

(56) References Cited

U.S. PATENT DOCUMENTS

| 6,515,428 | B1 * | 2/2003 | Yeh et al. | 315/169.3 |
| 6,803,121 | B2 * | 10/2004 | Sakai et al. | 428/690 |
| 7,115,904 | B2 * | 10/2006 | Ishida et al. | 257/59 |
| 7,161,291 | B2 * | 1/2007 | Mori et al. | 313/503 |
| 2004/0217698 | A1 * | 11/2004 | Lee et al. | 313/504 |

FOREIGN PATENT DOCUMENTS

| CN | 1432854 | 7/2003 |
| JP | 10-289784 | 10/1998 |
| JP | 11-339968 | 12/1999 |
| JP | 2001-52870 | 2/2001 |
| JP | 2003-109770 | 4/2003 |
| JP | 2003-257655 | 9/2003 |
| JP | 2004-127639 | 4/2004 |

OTHER PUBLICATIONS

Office Action dated Apr. 11, 2008 for corresponding Chinese Patent Application No. 200510115586.7 and English translation.

* cited by examiner

*Primary Examiner*—Joseph L Williams
(74) *Attorney, Agent, or Firm*—Christie, Parker & Hale, LLP

(57) ABSTRACT

An organic light emitting display and a method of fabricating the same are provided. The organic light emitting display includes a pixel electrode, an organic layer including at least an emission layer, and an opposite electrode. An electron injection layer interposed between the emission layer and the opposite layer may be formed of an optimal thickness of NaF layer to reduce the thickness of the electron injection layer.

14 Claims, 2 Drawing Sheets

ORGANIC LIGHT EMITTING DISPLAY HAVING AN NAF LAYER AND METHOD OF FABRICATING THE ORGANIC LIGHT EMITTING DISPLAY

CROSS-REFERENCE TO RELATED APPLICATION

This application claims priority to and the benefit of Korean Patent Application No. 2004-90054, filed Nov. 5, 2004, which is incorporated herein by reference in its entirety.

BACKGROUND OF THE INVENTION

1. Field of the Invention

The present invention relates to an organic light emitting display and a method of fabricating the same, and more particularly, to an organic light emitting display and a method of fabricating the same that are capable of reducing the total thickness of an organic layer by forming an optimal thickness of NaF layer between an emission layer and an opposite electrode of an organic light emitting display.

2. Description of the Related Art

In general, an organic light emitting display (OLED) is a self emissive display which electrically excites an organic compound to emit light. The OLED is classified into a passive matrix OLED and an active matrix OLED depending on a method of driving N×M pixels disposed in a matrix manner. The active matrix OLED has an advantage capable of easily realizing a high resolution and large-sized display, since the active matrix OLED has low power consumption in comparison with the passive matrix OLED. In addition, the OLED is classified into a top emission OLED, a bottom emission OLED, and a both-sides emission OLED having top and bottom emission directions, depending on an emission direction of light emitted from the organic compound. The top emission OLED has an advantage of a large aperture ratio, since the top emission OLED emits light in a reverse direction of a substrate, differently from the bottom emission OLED.

As the display device has been miniaturized and therefore low power consumption is required, an OLED including a main display window of a top emission OLED formed at one surface and a sub-display window of a bottom emission OLED formed at the other surface is widely used. The above-mentioned OLED is mainly used in a mobile phone, which includes a sub-display window formed at an exterior part and a main display window formed at an interior part. In case of a call waiting state of the mobile phone, a user can observe receiving sensitivity, battery residual capacity, time, and so on, through the auxiliary display window that consumes relatively low power.

FIG. 1 is a cross-sectional view of a conventional organic light emitting display.

First, a predetermined thickness of buffer layer 110 is formed on a transparent insulating substrate 100, and a thin film transistor including a polysilicon pattern 122, a gate electrode 132, and source and drain electrodes 150 and 152 is formed on the buffer layer 110. In this process, source and drain regions 120, into which impurities are injected, are disposed at both sides of the polysilicon pattern 122, and a gate insulating layer 130 is disposed on an entire surface including the polysilicon pattern 122.

Next, a predetermined thickness of passivation layer 160 is formed on the entire surface of the resultant structure, and the passivation layer 160 is etched by photolithography and etching processes to form a first via contact hole (not shown) for exposing one of the source and drain electrodes 150 and 152, for example, the drain electrode 152. The passivation layer 160 may be formed of a silicon oxide layer, a silicon nitride layer, or a stacked layer thereof.

A first insulating layer 170 is formed on the entire surface of the resultant structure. The first insulating layer 170 may be formed of one selected from a group consisting of polyimide, benzocyclobutene series resin, spin on glass (SOG), and acrylate, and functions to planarize an emission region.

Then, the first insulating layer 170 is etched by the photolithography and etching processes to form a second via contact hole (not shown) for exposing the first via contact hole.

Next, a pixel electrode 180 is formed through the second via contact hole to be connected to one of the source and drain electrodes 150 and 152, for example, the drain electrode 152. In this process, when the OLED is a top emission OLED, the pixel electrode 180 is formed of a reflective electrode, and when a bottom emission OLED, the pixel electrode 180 is formed of a transparent electrode. When the pixel electrode is the reflective electrode, the pixel electrode is formed in a stacked structure of the reflective electrode and the transparent electrode.

Next, a second insulating layer (not shown) is formed on the entire surface of the resultant structure. The second insulating layer may be formed of one selected from a group consisting of polyimide, benzocyclobutene series resin, phenol resin, and acrylate. Then, a second insulating layer pattern 190 for defining an emission region is formed by a photolithography process.

Then, an organic layer 182 including at least an emission layer is formed at the region defined by the second insulating layer pattern 190 through a small molecule deposition method or a laser induced thermal imaging method. The organic layer 182 may further include at least one layer selected from a group consisting of an electron injection layer, an electron transport layer, a hole blocking layer, a hole injection layer, and a hole transport layer.

Next, a predetermined thickness of LiF layer 184 is formed on the organic layer 182. At this time, the LiF layer 184 is an interface layer between the organic layer 182 and an opposite electrode 186, and has a thickness of about 3~10 Å. The LiF layer 184 improves electron injection characteristics to decrease a work function of the opposite electrode 186, increase luminous efficiency, and lower a driving voltage.

Next, the opposite electrode 186 is formed on the LiF layer 184. The opposite electrode 186 is formed of a transparent metal electrode such as an Mg—Ag or Ca layer.

Then, a passivation layer (not shown) is formed on the opposite electrode 186. The passivation layer is formed of an inorganic insulating layer such as a silicon nitride layer.

However, in the conventional OLED, it is difficult to adapt an optimal thickness of organic layer between the pixel electrode and the opposite electrode in order to increase the luminous efficiency and decrease the driving voltage.

SUMMARY OF THE INVENTION

The present invention, therefore, provides an organic light emitting display and a method of fabricating the same that are capable of improving luminous efficiency by interposing an optimal thickness of NaF layer between an emission layer and an opposite electrode.

In an exemplary embodiment of the present invention, an organic light emitting display includes: a pixel electrode disposed on a substrate; an organic layer disposed on the pixel electrode and including at least an emission layer; an NaF layer disposed on the organic layer and having a thickness of 3~5 Å; and an opposite electrode disposed on the NaF layer, wherein preferably, the NaF layer has a thickness of 4 Å.

In another exemplary embodiment according to the present invention, a method of fabricating an organic light emitting display includes: forming a pixel electrode on a substrate; forming an organic layer including at least an emission layer on the pixel electrode; forming an NaF layer having a thickness of 3-5 Å on the organic layer; and forming an opposite electrode on the NaF layer, wherein preferably, the NaF layer is formed to a thickness of 4 Å.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein.

Figure 1:
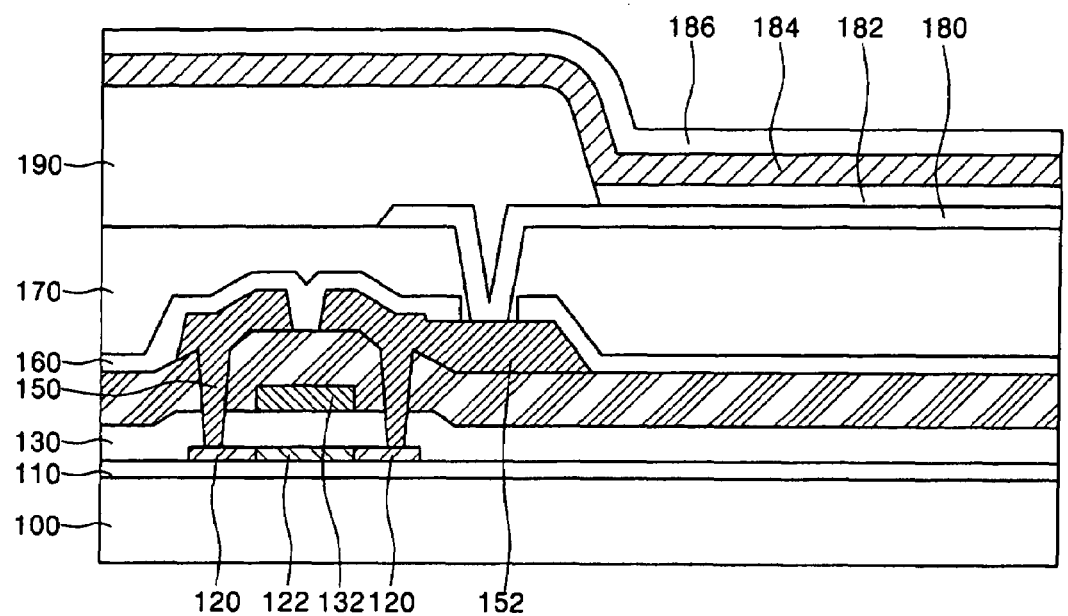
FIG. 1 is a cross-sectional view of a conventional organic light emitting display.
Figure 2:
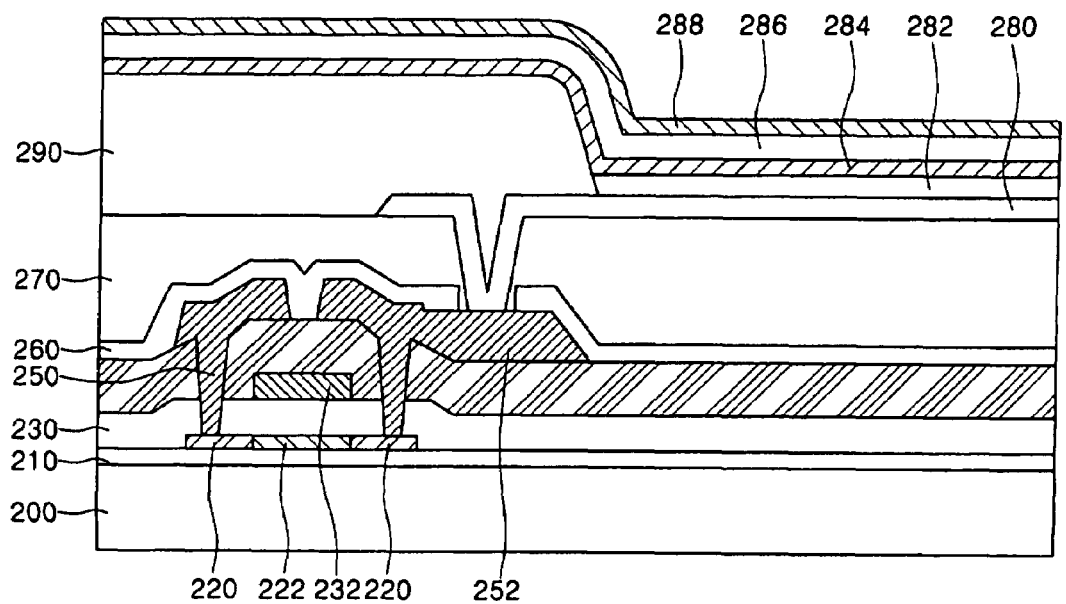
FIG. 2 is a cross-sectional view of an organic light emitting display in accordance with the present invention.

FIG. 2 is a cross-sectional view of an organic light emitting display in accordance with the present invention.

A predetermined thickness of buffer layer 210 is formed on a transparent substrate 200, and a thin film transistor including a polysilicon pattern 222, a gate electrode 232, and source and drain electrodes 250 and 252 is formed on the buffer layer 210. In this process, source and drain regions 220, into which impurities are injected, are disposed at both sides of the polysilicon pattern 222, and a gate insulating layer 230 is disposed on an entire surface including the polysilicon pattern 222.

Next, a predetermined thickness of passivation layer 260 is formed on the entire surface of the resultant structure, and the passivation layer 260 is etched by photolithography and etching processes to form a first via contact hole (not shown) for exposing one of the source and drain electrodes 250 and 252, for example, the drain electrode 252. The passivation layer 260 may be formed of a silicon oxide layer, a silicon nitride layer, or a stacked layer thereof.

A first insulating layer 270 is formed on the entire surface of the resultant structure. The first insulating layer 270 may be formed of one selected from a group consisting of polyimide, benzocyclobutene series resin, spin on glass (SOG), and acrylate, and functions to planarizes an emission region.

Then, the first insulating layer 270 is etched by the photolithography and etching processes to form a second via contact hole (not shown) for exposing the first via contact hole.

Next, a reflective layer (not shown) is formed on the entire surface of the resultant structure. In this process, the reflective layer is formed of one metal, having high reflectivity, selected from a group consisting of Al, Al alloy, Mo, Ti, Au, Ag and Pd.

Next, the reflective layer is subjected to a photolithography process to form a reflective layer pattern (not shown) in an emission region.

Next, a thin layer for a pixel electrode (not shown) is formed on the entire surface of the resultant structure. The thin layer for a pixel electrode is formed of a transparent metal material such as indium tin oxide (ITO).

Then, the thin layer for a pixel electrode is etched by photolithography and etching processes to form a pixel electrode 280. The pixel electrode 280 is connected to one of the source and drain electrodes 250 and 252 exposed through the second via contact hole, for example, the drain electrode 252. In this process, the pixel electrode 280 is a reflective electrode including a reflective layer pattern disposed thereunder.

Next, a second insulating layer (not shown) is formed on the entire surface of the resultant structure. The second insulating layer may be formed of one selected from a group consisting of polyimide, benzocyclobutene series resin, phenol resin, and acrylate. Then, a second insulating layer pattern 290 for defining an emission region of the pixel electrode 280 is formed by a photolithography process.

Next, an organic layer 282 including at least an emission layer is formed in an emission region of the pixel electrode 280. The organic layer 282 is formed by a small molecule deposition method or a laser induced thermal imaging method. The organic layer 282 may further include at least one layer selected from a group consisting of an electron injection layer, an electron transport layer, a hole injection layer, a hole transport layer, and a hole blocking layer.

Then, a NaF layer 284 is formed on the entire surface of the resultant structure. The NaF layer 284 is formed to improve electron injection characteristics to decrease a work function of an opposite electrode 286, increase emission efficiency, and lower a driving voltage. The NaF layer 284 is formed to a thickness of 3~5 Å, the most preferably, 4 Å.

Next, the opposite electrode 286 is formed on the NaF layer 284. The opposite electrode 286 is formed of a light transmissive metal layer such as an MgAg layer, a CaAg layer, a Ca layer, a BaAg layer, and so on.

Next, a passivation layer 288 is formed on the opposite electrode 286. The passivation layer may be formed of an inorganic insulating layer such as a silicon nitride layer.

Then, a transparent encapsulating substrate is sealed on the opposite electrode to complete the OLED.

Figure 3:
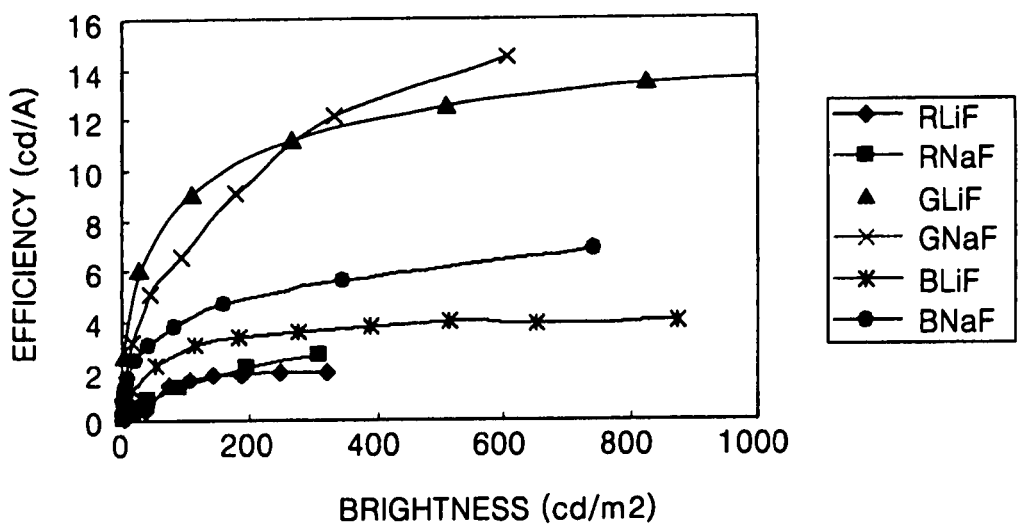
FIG. 3 is a graph showing brightness and efficiency of each of R, G and B pixels, when an LiF layer and an NaF layer are used in an organic light emitting display in accordance with the present invention.

FIG. 3 is a graph showing brightness and efficiency of each of R, G and B pixels, when a LiF layer and a NaF layer are used in an organic light emitting display in accordance with the present invention. As shown in FIG. 3, it is appreciated that efficiency of each pixel is not degraded although the NaF layer is interposed between the emission layer and the opposite electrode. Especially, when the brightness is larger than 200 cd/m$^2$, red light has more excellent efficiency.

Figure 4:
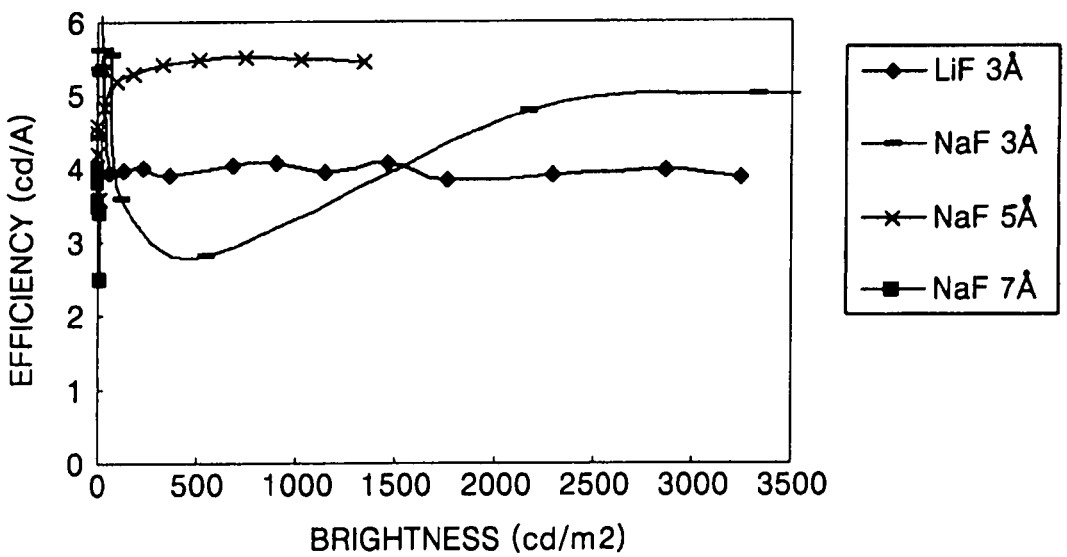
FIG. 4 is a graph showing brightness and efficiency versus each thickness of the NaF layer in accordance with an embodiment of the present invention.

FIG. 4 is a graph showing brightness and efficiency versus each thickness of the NaF layer in accordance with an embodiment of the present invention. Comparing each emission efficiency when a 3 Å of LiF layer, 3 Å, 5 Å and 7 Å of NaF layers are used in the OLED, it is appreciated that the 3 Å and 5 Å of NaF layers have an efficiency better than that of the LiF layer. Meanwhile, when the 7 Å of NaF layer is used, device characteristics do not exist.

As can be seen from the foregoing, it is possible to replace the conventional LiF layer without variation of optical characteristics of the OLED by forming the NaF layer having a thickness of about 3~5 Å between the emission layer and the opposite electrode.

Therefore, it is advantageous to reduce a thickness of the organic layer between the emission layer and the opposite electrode, while maintaining device characteristics.

Although the present invention has been described with reference to certain exemplary embodiments thereof, changes may be made to the described embodiments without departing from the scope of the present invention.

What is claimed is:

1. An organic light emitting display comprising:
    a pixel electrode disposed on a substrate;
    an organic layer disposed on the pixel electrode and including at least an emission layer;
    an NaF layer disposed on the organic layer and having a thickness of 3~5 Å; and
    an opposite electrode disposed on the NaF layer.

2. The organic light emitting display according to claim 1, further comprising at least one thin film transistor between the substrate and the pixel electrode.

3. The organic light emitting display according to claim 1, wherein the pixel electrode is a reflective electrode.

4. The organic light emitting display according to claim 1, wherein the organic layer comprises at least one thin layer selected from a group consisting of a hole injection layer, a hole transport layer, a hole blocking layer, an electron transport layer, and an electron injection layer.

5. The organic light emitting display according to claim 1, wherein the NaF layer has a thickness of 4 Å.

6. The organic light emitting display according to claim 1, wherein the opposite electrode is a transmissive metal electrode.

7. The organic light emitting display according to claim 1, further comprising a passivation layer formed on the opposite electrode.

8. A method of fabricating an organic light emitting display, comprising:
    forming a pixel electrode on a substrate;
    forming an organic layer including at least an emission layer on the pixel electrode;
    forming an NaF layer having a thickness of 3~5 Å on the organic layer; and
    forming an opposite electrode on the NaF layer.

9. The method according to claim 8, further comprising forming at least one thin film transistor between the substrate and the pixel electrode.

10. The method according to claim 8, wherein the pixel electrode is a reflective electrode.

11. The method according to claim 8, wherein the organic layer comprises at least one thin layer selected from a group consisting of a hole injection layer, a hole transport layer, a hole blocking layer, an electron transport layer, and an electron injection layer.

12. The method according to claim 8, wherein the NaF layer is formed to a thickness of 4 Å.

13. The method according to claim 8, wherein the opposite electrode is a transmissive metal electrode.

14. The method according to claim 8, further comprising forming a passivation layer on the opposite electrode.

* * * * *